United States Patent [19]

Gergel et al.

[11] Patent Number: 5,438,273
[45] Date of Patent: Aug. 1, 1995

[54] SYSTEM FOR TESTING THE VOICE COIL ELEMENT OF A DISK DRIVE ROTARY ACTUATOR

[75] Inventors: Oleg A. Gergel, Mountain View; Mostafa Mahmoudian, San Carlos; Jagdeep S. Buttar, Union City; Neil Motiska, Danville, all of Calif.

[73] Assignee: Read-Rite Corporation, Milpitas, Calif.

[21] Appl. No.: 299,524

[22] Filed: Sep. 1, 1994

[51] Int. Cl.⁶ .......................................... G01R 31/06
[52] U.S. Cl. ................... 324/546; 324/656; 369/55
[58] Field of Search ............... 369/53, 55; 324/546, 324/654, 656, 212

[56] References Cited

U.S. PATENT DOCUMENTS 3,869,664  3/1975  Safer ............................ 324/546
5,036,285  7/1991  Shaw ............................ 324/546

FOREIGN PATENT DOCUMENTS 3291573  12/1991  Japan ............................ 324/546
2212927  8/1989  United Kingdom ............... 324/546

Primary Examiner—Kenneth A. Wieder
Attorney, Agent, or Firm—Nathan N. Kallman

[57] ABSTRACT

A system for testing a voice coil member of a rotary actuator head stack assembly (HSA) of a disk drive includes a plurality of testing circuits, each of which selectively performs at least one predefined test on the voice coil member. During testing, the head stack assembly is removably mounted on a base plate with the axis of rotation of the head stack assembly normal to the top surface of said base plate. A flat reference coil is disposed in a fixed position parallel to the top surface of the base plate to provide an inductively coupled relationship between the reference coil and the coil under test. The ends of the coil under test are connected to a pair of terminals in the base plate. A polarity test circuit for determining the polarity of the coil under test is connected to the terminals. Other test circuits are selectively connected to the terminals and the tests are conducted in a controlled sequence without the need to move the fragile head stack assembly.

12 Claims, 2 Drawing Sheets

SYSTEM FOR TESTING THE VOICE COIL ELEMENT OF A DISK DRIVE ROTARY ACTUATOR

BACKGROUND OF THE INVENTION

1. Field of the Invention

This invention relates to systems for testing the electrical characteristics of a voice coil member and in particular to a system in which the position of the voice coil member to be tested relative to the tester is not critical to the accuracy of the tests for several different electrical characteristics.

2. DESCRIPTION OF THE PRIOR ART

Disk drives are used extensively for storing information in computer systems. The disks are continuously rotated relative to one or more magnetic transducers which are movable along a substantially radial path relative to the disk by an electromagnetic actuator.

Typically, the transducers are spaced from the disk surface by an air bearing support member which flies at a very small distance above the surface. The transducers are moved to a selected track in response to an address signal supplied to the transducer positioning system which controls the operation of the electromagnetic actuator. The electromagnetic actuator includes the "voice coil", which is positioned adjacent to a magnetic structure so that when the coil is energized, the coil has a tendency to move due to the interaction of the magnetic field from the magnetic structure and the current in the coil.

Transducer positioning systems initially employed an actuator in which a cylindrical type "voice coil" was positioned in the air gap of a cylindrical magnetic pole structure. In this arrangement, the movement was a straight line path. Subsequently because of the desire to minimize the overall size of disk drives, rotary actuators were developed in which a flat coil was employed in place of the cylindrical coil member. By mounting the flat coil on a support member that was affixed to a shaft carrying the head arm assemblies, the coil could be positioned relative to a permanent magnetic structure to cause the shaft to pivot when the coil was energized, thereby moving the transducers along a slightly radial arc relative to the concentric recording tracks.

The electrical characteristics of voice coils become more critical as the track density of the magnetic storage disks increases. As the various technologies involved with disk drives have progressed, the various elements of the head stack assembly of the disk drive have become smaller and smaller. This has led to a serious problem in the manufacture of these assemblies in that the smaller components are more fragile and subject to damage as various steps in the manufacturing process are encountered.

The prior art has generally conducted several tests on the voice coil of the actuator. These tests included a test for the resistance of the coil to ensure it was within predetermined limits. A polarity check is also generally conducted to ensure that the ends of the coil have been connected to the correct terminals. Another test involved checking to ensure that the coil circuit was complete and not open. A similar check was made to ensure that some part of the coil was not shorted out to ground. In the past, the various tests were performed serially, and generally involved moving the entire assembly containing the coil to a series of different test stations. In the past when the various components were not so fragile, there was only a minimal possibility of damage to the various components. However, with current technology, the possibility of damage to the fragile components has increased to the point where the manufacturing process philosophy is to minimize the movement of the head stack assembly and voice coil during the manufacturing process. The present invention provides an electrical test system in which a plurality of required tests are conducted substantially simultaneously on the flat voice coil of a rotary actuator without moving the assembly between tests and with only a minimal concern of the initial position of the coil relative to the test system.

SUMMARY OF THE INVENTION

In accordance with the present invention, a voice coil testing system is provided for conducting a polarity check, a resistance check, a short to ground test, an open coil test and a shorted turn test, all of which can be conducted substantially at the same time without moving the voice coil being tested to various positions. The system comprises three functional test sections. The voice coil is selectively connected directly to the first section whose function is to perform a short to ground test. The voice coil is also selectively connected directly to the second section whose function is to perform the resistance check, the open coil test and the shorted turn test. The coil is selectively connected inductively to the third section which functions to check the polarity of the coil by comparing the phase of an input sine wave type signal to the output signal of a reference coil that is inductively coupled to the voice coil.

The three sections share common circuitry and sequence control signals to perform all the tests in a few seconds without moving the coil. Since the polarity test section is inductively coupled to the voice coil and employs phase comparison logic, the position of the voice coil during the test is not critical and positioning the head stack assembly with the voice coil in the test fixture takes only minimal time since no precise positioning is necessary. A flex member, which normally carries the voice coil leads for attaching the coil to the positioning system on the disk drive, is readily connectable to similar terminals on the test fixture. These terminals are associated with the first and second sections during the testing operation.

An object of the present invention is to provide an improved system for testing a voice coil member associated with a head stack assembly of a rotary actuator used in a transducer positioning system of a disk drive data storage apparatus.

Another object of the present invention is to provide a voice coil testing system in which the position of the voice coil during various tests is not critical and in which repositioning of the voice coil between sequential tests is eliminated.

DESCRIPTION OF THE PREFERRED EMBODIMENT

Figure 1:
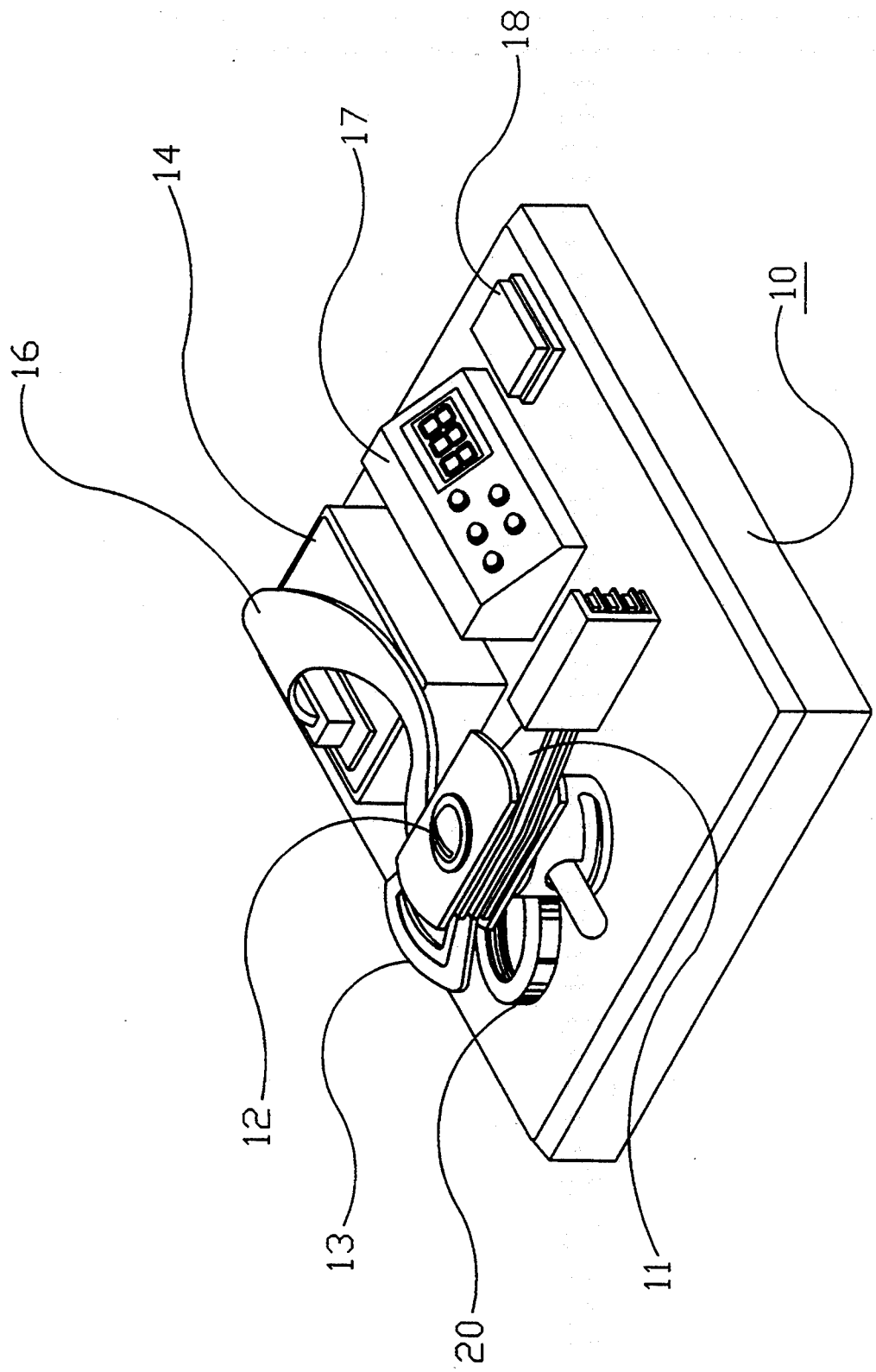
FIG. 1 is a plan view of a test fixture showing the head stack assembly including the flat voice coil during the testing operation which incorporates the test system of the present invention.

The test fixture as shown in FIG. 1 includes a base member 10, and a head stack assembly 11, (hereafter HSA), with its axis of rotation 12 disposed normal to the plane of base 10. HSA 11 may be of the type described and claimed in patent application Ser. No 08/043,640 now abandoned, assigned to the same Assignee as the present invention. HSAs generally comprise a shaft which is mounted normal to the base plate of the drive for pivotal motion about the axis of the shaft. A plurality of head-arm assemblies are mounted on the shaft along with suitable spacers between adjacent head arm assemblies. A voice coil member 13 is also mounted on the shaft and extends outward in a direction opposite to the head arm assemblies. The flex member may also be mounted on the shaft and carries the circuits for providing various signals between the transducers and the voice coil.

As shown, the plane of the voice coil 13 is parallel to base 10. A circuit board 14 is mounted on the base 10 and contains the circuit components of the system shown schematically in FIG. 2. The flex member 16 of the HSA 11 carries the leads of the voice coil 13 and is connected to the board 14 during test. Visual indicators 17 display the results of the various tests. A start test button 18 is also provided to control the start of the test.

A reference coil 20 (FIG. 2) is mounted to the base 10 and is an integral part of the system. During the test, reference coil 20 is inductively coupled to voice coil 13.

Figure 2:
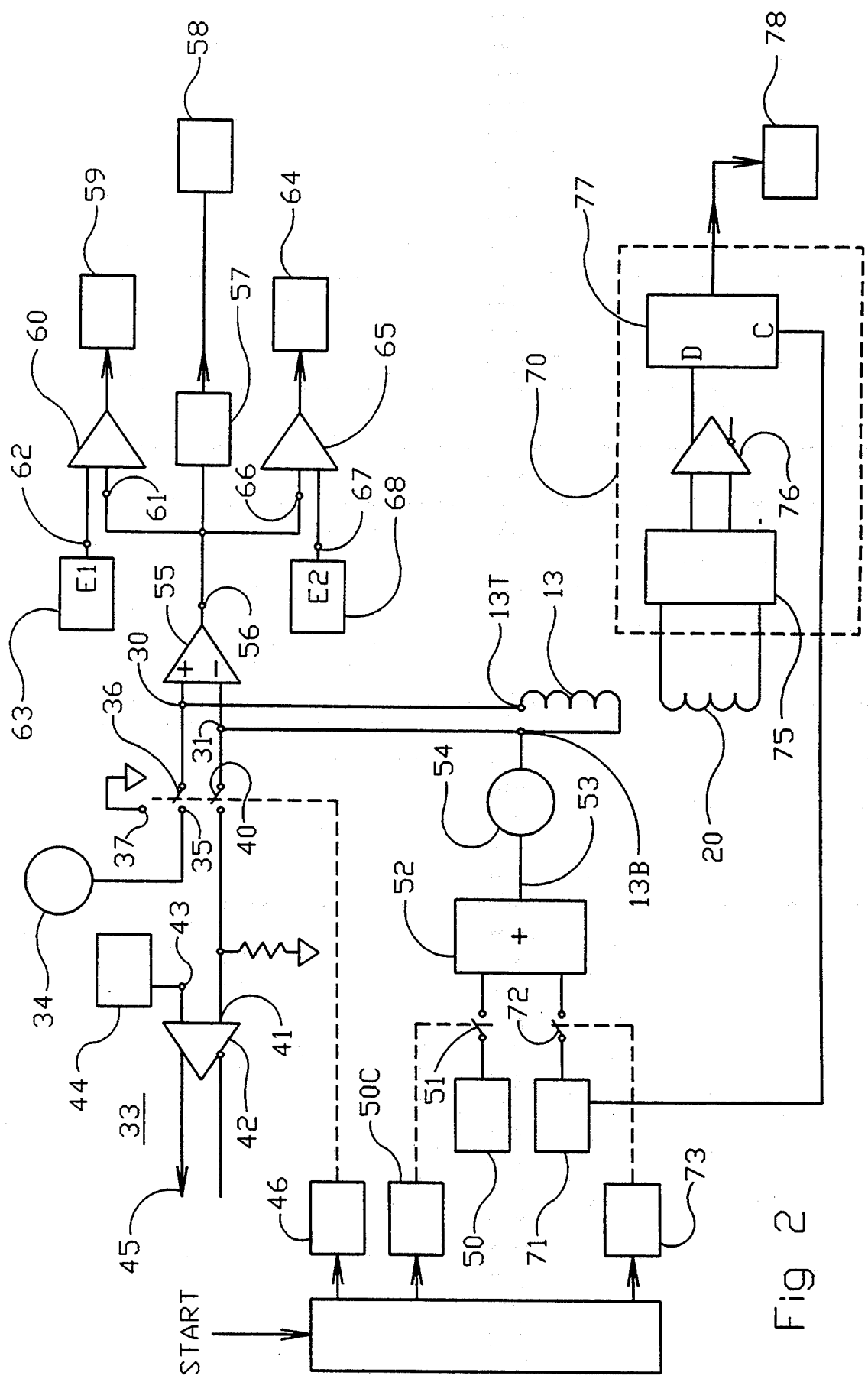
FIG. 2 is schematic view of the test system of the present invention.

The system for testing the voice coil is shown in FIG. 2 wherein the coil under test is designated by reference character 13 and the reference coil shown in FIG. 2 is designated by reference character 20. The ends 13T and 13B of coil 13 are connected by conductors on the flex member 16 to terminals 30 and 31. The Short to Ground section 33 of the test system comprises a current source 34, connected to terminal 30 through one contact 35 of a double throw double contact switch 36. The other contact 37 of switch 36 is connected to ground. A second single pole single throw switch 40 connects terminal 31 to one input 41 of a comparator 42 having a second input terminal 43 connected to a reference voltage source 44. The output 45 of comparator 42 is connected to a suitable indicator (not shown). Control logic 46 controls the positioning of the switches 36 and 40. The operation of this section is explained later in connection with the operation of the complete test system.

The next functional section involves the check of the resistance of the voice coil 13, the open coil test and the shorted turn test. This section includes a voltage reference source 50 connected through a switch 51 to a summing circuit 52 which has an output terminal 53 connected to a current source 54. Source 54 in turn is connected to end 13B of the voice coil 13 under test. Summing circuit 52 functions as a summing junction to sum the reference voltage from reference voltage source 50 and the signal from signal generator 71.

An amplifier 55, comprising for example three operational amplifiers, has it input terminal connected to terminals 30 and 31 and its output terminal 56 connected to an analog-to-digital converter 57. The output of converter 57 comprises a multi-bit digital value corresponding to a resistance value which may be displayed to the operator or alternatively be supplied to a digital comparator 58 that determines if the input value lies within a certain permitted range.

The open coil test involves a voltage comparator 60 having one input terminal 61 connected to output terminal 56 of the amplifier 55 and the other input terminal 62 connected to a reference voltage source 63. The output of comparator 60 controls an indicator 59 to signify when the test is successful.

The shorted turn test is similar and involves a voltage comparator 65 having one input terminal 66 connected to terminal 56 of amplifier 55 and a second terminal 67 connected to a reference voltage source 68. The output terminal of comparator 65 is supplied to an indicator 64 to signify a shorted turn or coil. Switch 51 is actuated in response to a signal from control module 50C.

The last section of the test system involves the polarity test of the coil to ensure that the ends of the coil are not reversed. This test involves the reference coil 20 which is connected to block 70 that functions as a phase comparator. Block 70 compares the relative phase of the signal supplied directly from signal generator 71 to the signal induced into the reference coil 20, when the signal generator 71 is connected to terminal 13B of coil 13 through switch 72, summing block 52, and current source 54. Control module 73 controls switch 72.

Phase comparator 70 as shown in FIG. 2 comprises a buffer 75 connected to a comparator 76 having it output connected to a flip-flop 77, which in turn is connected to an indicator 78.

Control logic 73 controls the position of switch 72. Buffer 75 is in practice a unity gain amplifier which functions to stabilize the signal induced in reference winding 20.

The operation of the test system will now be described. The HSA 11 including the flat coil member 13 is placed in the text fixture by inserting the shaft into an opening in the base plate 10. The HSA is oriented so that the voice coil member is positioned roughly above the stationary reference coil. This permits the voice coil when energized during the polarity check to induce a signal in the reference coil through a transformer type action. The test operator starts the test by pushing the start button 18 which is connected to sequencing controller 80 that functions to energize switch control modules 46, 50C and 73, and to operate in sequence after the start switch is pressed. When switches 36 and 41 are moved to a closed position from the open position, the current source 34 supplies current to coil 13 under test thereby providing a predetermined voltage to terminal 41 of comparator 42. The reference voltage 44 is applied to the other input terminal of comparator 42. If a short to ground exists in the coil 13 under test, the voltage at input terminal 41 is zero and the short to ground indicator is activated.

Next, the control module 50C causes switch 51 to close. Current source 54 supplies a signal to winding 13 which causes a voltage output of instrument amplifier that is related to the resistance of the coil 13 and the value of the current supplied by source 54. This voltage is supplied simultaneously to the A to D converter 57, the voltage comparator 60 and the voltage comparator 65. The digital value from the converter 57 is displayed to the operator or automatically checked by a digital comparator 58 to ensure that it is within a predetermined range. The voltage comparators 60 and 65 each of which is supplied with a different reference voltage need only to be sensitive enough to indicate respectively an open coil condition or a shorted turn condition in the coil under test 13.

The entire test takes only a few seconds, since after the start button is pushed the actual results are obtained in microseconds. An additional advantage is that the various current sources and voltage references may be readily adjusted to test different type voice coils.

The stack assembly being tested is designed to be used with a hard disk drive that operates as the data storage device for a lap top computer. The size of such drives are less than 3×3×0.5 inches. The structure is designed to have as little mass as possible and hence is quite fragile and susceptible to damage during handling unless extreme care is exercised. The present system eliminates many handling steps that were employed in the prior art and hence improves the overall yield of the process.

We claim:

1. A system for testing electrical characteristics of a voice coil member of a rotary actuator associated with a head stack assembly (HSA) of a disk drive comprising:
   a head stack assembly including a rotary actuator, said actuator comprising a voice coil member;
   a base plate having top and bottom surfaces and means for removably mounting said HSA with the axis of rotation of said head stack assembly normal to the top surface of said plate;
   a flat reference coil disposed in a fixed position parallel to said top surface of said base plate for providing an inductively coupled relationship between said reference coil and said voice coil member under test;
   means for coupling said voice coil member to said reference coil;
   a polarity test circuit for determining the polarity of said voice coil connections including said reference coil;
   a signal generator for supplying a test signal to said voice coil member;
   connection means for selectively connecting said polarity test circuit to said voice coil member including a pair of terminals for attaching said voice coil member;
   means for determining whether a test signal supplied to said voice coil member from said whether signal generator produces a signal in said reference coil which is in phase with said supplied test signal, whereby a polarity check determines if the ends of said coil are connected correctly, in which the accuracy of said check is not dependent on the precise positioning of the head stack assembly relative to said polarity checking means.

2. The system set forth in claim 1 in which said means for determining includes;
   a phase comparator connected to the output of said reference coil and the output of said signal generator, and
   a polarity indicator responsive to the output of said phase comparator.

3. The system set forth in claim 2 further including a plurality of other test circuits for selectively performing other tests on said voice coil, and means for selectively connecting each of said test circuits to said voice coil.

4. The system set forth in claim 3 in which one of said test circuits comprises means for detecting if said coil has a short to ground.

5. The system set forth in claim 4 in which one of said test circuits comprises means for determining if the resistance of said voice coil is within predetermined limits.

6. The system set forth in claim 5 in which said one of said test circuits comprises:
   a first reference voltage;
   a current source;
   means coupling said reference voltage to said current source and to said voice coil under test;
   an amplifier having its input connected to said terminals to provide a stabilized voltage corresponding to the voltage at said terminals developed by current from said current source flowing through said coil;
   an analog-to-digital converter connected to the output of said amplifier for providing a digital representation corresponding to the resistance of said voice coil under test;
   means for indicating if said digital representation is within a predetermined range of values.

7. The system set forth in claim 6 further including first comparator means having one input connected to the output of said amplifier and a second input connected to an open coil reference voltage source and an open coil indicator responsive to the output of said first comparator to indicate whether the voice coil under test is open.

8. The system set forth in claim 7 further including second comparator means having one input connected to the output of said amplifier and a second input connected to a shorted coil reference voltage source, and a shorted coil indicator responsive to the output of said second comparator to indicate whether the voice coil under test is shorted.

9. A system for testing the electrical characteristics of a voice coil member of a rotary actuator associated with a head stack assembly (HSA) a disk drive including means to perform a polarity check to determine if the ends of said coil are connected correctly in which the accuracy of said check is not dependent on the precise positioning of the head stack assembly relative to said polarity checking means, said system comprising:
   a rotatable head stack assembly including a rotary actuator, said actuator comprising a voice coil member;
   a base plate having top and bottom surfaces and means for removably mounting said head stack assembly with the axis of rotation of said head stack assembly normal to the top surface of said plate;
   a flat reference coil disposed in a fixed position parallel to said top surface of said base plate for providing an inductively coupled relationship between said reference coil and said voice coil member under test;
   a plurality of testing circuits, each of which selectively performs at least one predefined test on said voice coil member;
   connection means for selectively connecting each of said testing circuits to said voice coil member including a pair of terminals for attaching said voice coil member;
   said plurality of testing circuits including a polarity test circuit for determining the polarity of said coil connections to said pair of terminals, said polarity test circuit including said reference coil;
   a signal generator for supplying a test signal to said voice coil member;
   means for determining whether a test signal supplied to said voice coil from said signal generator induces a signal in said reference coil which is in phase with said supplied test signal, whereby the accuracy of said polarity test is not dependent on establishing a precise said coupling relationship when positioning said HSA on said base plate.

10. The system set forth in claim 9 in which said plurality of testing circuits comprise a circuit for testing whether the coil under test is shorted to ground, and a circuit for testing whether the resistance of the coil under test is within predetermined limits.

11. The system set forth in claim 10 in which said circuit for testing whether the resistance of the coil under test is within predetermined limits further includes a circuit for determining whether the coil under test is open circuited, and a circuit for determining whether the coil under test has a shorted turn.

12. The system set forth in claim 11 further including control means for selectively connecting said test circuits to said coil under test.

* * * * *